US008994478B1

(12) United States Patent
Sim et al.

(10) Patent No.: US 8,994,478 B1
(45) Date of Patent: Mar. 31, 2015

(54) COMMON MODE FILTER

(71) Applicant: Samsung Electro-Mechanics Co., Ltd., Suwon (KR)

(72) Inventors: Won-Chul Sim, Suwon (KR); Hye-Won Bang, Suwon (KR); Ju-Hwan Yang, Suwon (KR); Jin-Hyuck Yang, Suwon (KR); Young-Do Kweon, Suwon (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 0 days.

(21) Appl. No.: 14/250,998

(22) Filed: Apr. 11, 2014

(30) Foreign Application Priority Data

Nov. 22, 2013 (KR) ........................ 10-2013-0143275

(51) Int. Cl.
*H03H 7/00* (2006.01)
*H01P 1/20* (2006.01)

(52) U.S. Cl.
CPC .................................... *H01P 1/2002* (2013.01)
USPC ........................... 333/185; 336/200; 29/602.1

(58) Field of Classification Search
USPC ................... 333/185; 336/200, 206; 29/602.1
See application file for complete search history.

(56) References Cited

U.S. PATENT DOCUMENTS

2005/0104705 A1* 5/2005 Mukherjee et al. ........... 336/200
2010/0157565 A1* 6/2010 Yoshida et al. ............... 361/811
2013/0244343 A1* 9/2013 Chang et al. ....................... 438/3
2014/0167902 A1* 6/2014 Yoon et al. .................... 336/207

* cited by examiner

*Primary Examiner* — Quan Tra

(57) ABSTRACT

A common mode filter is disclosed. The common mode filter in accordance with an aspect of the present invention includes: a first dielectric layer having a first groove formed along an outer boundary portion thereof; a second dielectric layer coated on the first dielectric layer so as to cover a first coil laminated on the first dielectric layer, having a first protrusion corresponding to the first groove formed on one surface thereof being in contact with the first dielectric layer, and having a second groove formed on the other surface thereof; and a third dielectric layer coated on the second dielectric layer so as to cover a second coil laminated on the second dielectric layer, having a second protrusion corresponding to the second groove formed on one surface thereof being in contact with the second dielectric layer, and having a third groove formed on the other surface thereof.

9 Claims, 3 Drawing Sheets

COMMON MODE FILTER

CROSS-REFERENCE TO RELATED APPLICATIONS

This application claims the benefit of Korean Patent Application No. 10-2013-0143275, filed with the Korean Intellectual Property Office on Nov. 22, 2013, the disclosure of which is incorporated herein by reference in its entirety.

BACKGROUND

1. Technical Field

The present invention relates to a common mode filter.

2. Background Art

With the recent technological advancement, a growing number of electronic devices, such as mobile phones, home electronic appliances, PCs, PDAs and LCDs, have been changed from analog systems to digital systems. Moreover, owing to the increased amount of processed data, the electronic devices are required to be faster.

As the electronic devices are digitized and become faster, the electronic devices can be increasingly sensitive to irritation from outside. That is, any small abnormal voltage or high-frequency noise brought into the internal circuitry of an electronic device from the outside can cause a damage to the circuitry or a signal distortion.

Sources of the abnormal voltage and noise that cause the circuitry damage or signal distortion of the electronic device include lightning, discharging of static electricity that has been charged in human body, switching voltage generated in the circuitry, power noise included in the electric source voltage, unnecessary electromagnetic signal or electromagnetic noise, etc.

In order to prevent the circuitry damage or signal distortion of the electronic device, a filter needs to be installed to prevent the abnormal voltage and high-frequency noise from being brought into the circuitry. Particularly, a common mode filter is often installed in, for example, a high-speed differential signal line in order to remove common mode noise.

The related art of the present invention is disclosed in Korea Patent Publication No. 10-2012-0033644 (laid open on Apr. 9, 2012).

SUMMARY

The present invention provides a common mode filter that can enhance interface adhesion and effectively prevent penetration of moisture through an interface.

An aspect of the present invention provides a common mode filter, which includes: a first dielectric layer having a first groove formed along an outer boundary portion thereof; a second dielectric layer coated on the first dielectric layer so as to cover a first coil laminated on the first dielectric layer, having a first protrusion corresponding to the first groove formed on one surface thereof being in contact with the first dielectric layer, and having a second groove formed on the other surface thereof; and a third dielectric layer coated on the second dielectric layer so as to cover a second coil laminated on the second dielectric layer, having a second protrusion corresponding to the second groove formed on one surface thereof being in contact with the second dielectric layer, and having a third groove formed on the other surface thereof.

The first to third grooves can be formed in plural rows on the first to third dielectric layers, respectively.

The first to third grooves can be formed in such a way that longitudinal positions thereof are misaligned with one another.

Another aspect of the present invention provides a common mode filter, which includes: a first dielectric layer having a first protrusion formed along an outer boundary portion thereof; a second dielectric layer coated on the first dielectric layer so as to cover a first coil laminated on the first dielectric layer, having a first groove corresponding to the first protrusion formed on one surface thereof being in contact with the first dielectric layer, and having a second protrusion formed on the other surface thereof; and a third dielectric layer coated on the second dielectric layer so as to cover a second coil laminated on the second dielectric layer, having a second groove corresponding to the second protrusion formed on one surface thereof being in contact with the second dielectric layer, and having a third protrusion formed on the other surface thereof.

The first to third protrusions can be formed in plural rows on the first to third dielectric layers, respectively.

The first to third protrusions can be formed in such a way that longitudinal positions thereof are misaligned with one another.

The first to third protrusions can be formed with a metal pattern laminated on the first to third dielectric layers, respectively.

DETAILED DESCRIPTION

Figure 1:
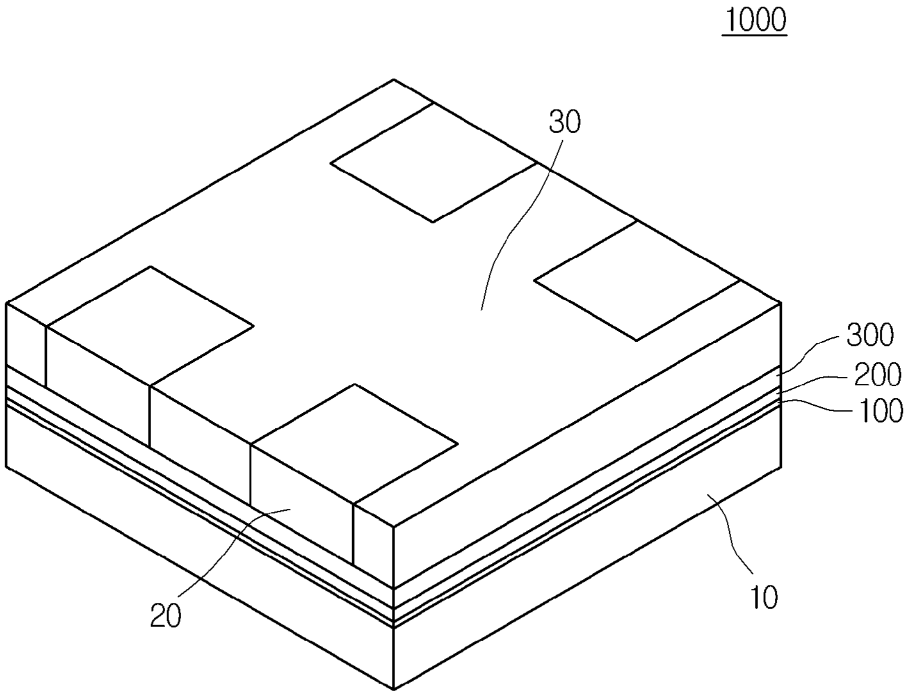
FIG. 1 is a brief illustration of a common mode filter in accordance with an embodiment of the present invention.

Hereinafter, certain embodiments of a common mode filter in accordance with the present invention will be described in detail with reference to the accompanying drawings. In describing the present invention with reference to the accompanying drawings, any identical or corresponding elements will be assigned with same reference numerals, and no redundant description thereof will be provided.

Terms such as "first" and "second" can be used in merely distinguishing one element from other identical or corresponding elements, but the above elements shall not be restricted to the above terms.

When one element is described to be "coupled" to another element, it does not refer to a physical, direct contact between these elements only, but it shall also include the possibility of yet another element being interposed between these elements and each of these elements being in contact with said yet another element.

Figure 2:
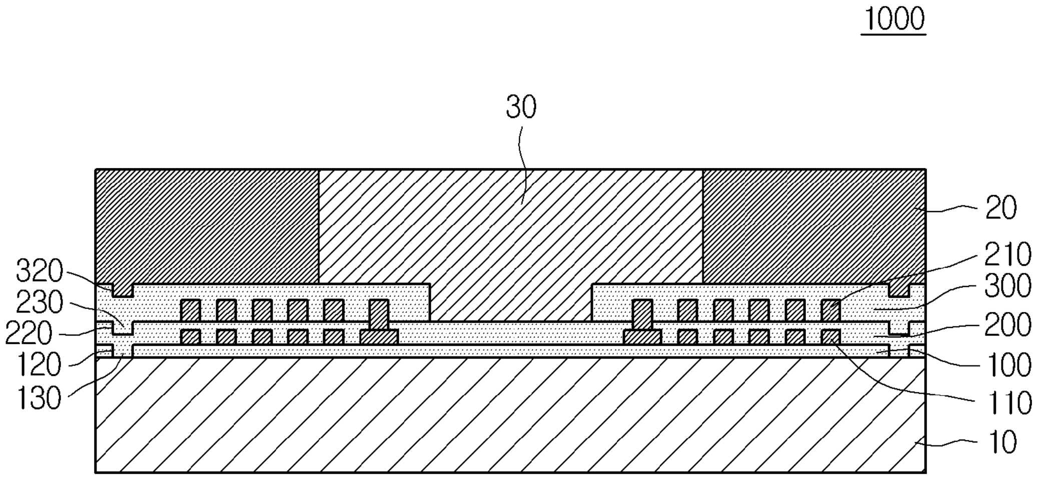
FIG. 2 shows a longitudinal section of the common mode filter in accordance with an embodiment of the present invention.
Figure 3:
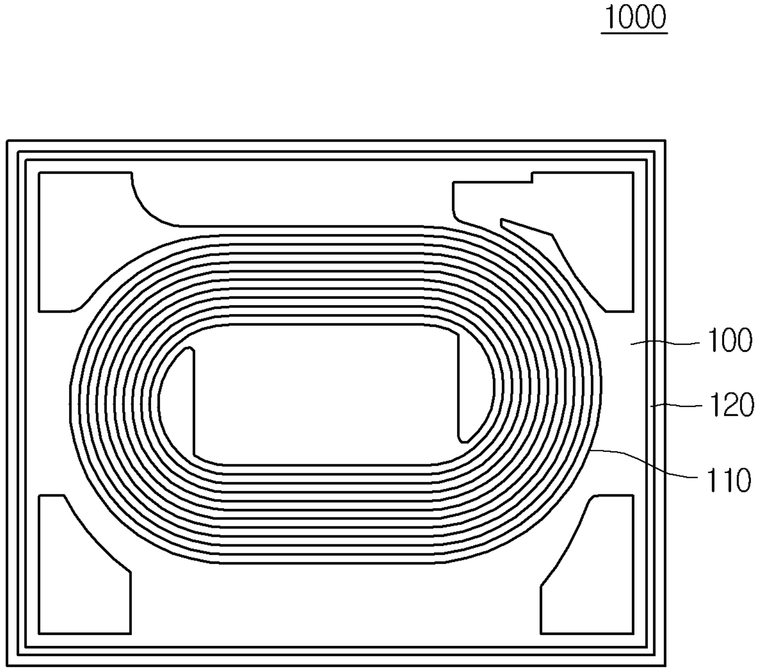
FIG. 3 shows a transverse section of the common mode filter in accordance with an embodiment of the present invention.

FIG. 1 is a brief illustration of a common mode filter in accordance with an embodiment of the present invention. FIG. 2 shows a longitudinal section of the common mode filter in accordance with an embodiment of the present invention. FIG. 3 shows a transverse section of the common mode filter in accordance with an embodiment of the present invention.

As illustrated in FIGS. 1 to 3, a common mode filter 1000 in accordance with an embodiment of the present invention can form a coil 110, 210 coated with a plurality of dielectric layers 100, 200, 300 on a substrate 10, form an external electrode 20 thereon, and form a filling layer 30 having, for example, a magnetic composite filled therein.

In such a case, the plurality of dielectric layers 100, 200, 300 formed in multiple layers can experience interfacial peeling due to stress and decreased reliability due to penetration of moisture because outer boundary portions of the dielectric layers 100, 200, 300 is exposed to outside.

Accordingly, the common mode filter 1000 in accordance with the present embodiment can have grooves 120, 220, 320 and protrusions 130, 230 formed at the respective outer boundary portions of the dielectric layers 100, 200, 300 to enhance interfacial adhesion and prevent the penetration of moisture into the interface.

Specifically, as illustrated in FIGS. 1 to 3, the common mode filter in accordance with the present embodiment includes a first dielectric layer 100, a second dielectric layer 200 and a third dielectric layer 300.

As shown in FIG. 3, the first dielectric layer 100 is a portion where a first groove 120 is formed along the outer boundary portion and can insulate the substrate 10 and a first coil 110 and provide smoothness of a surface on which the first coil 110 is laminated.

In such a case, the first dielectric layer 100 can be made of a photosensitive dielectric material so that the first groove 120 can be formed on the first dielectric layer 100 through a patterning process.

The second dielectric layer 200 can be coated on the first dielectric layer 100 so as to cover the first coil 110 that is laminated on the first dielectric layer 100, can have a first protrusion 130 corresponding to the first groove 120 formed on one surface thereof that is in contact with the first dielectric layer 100, and can have a second groove 220 formed on the other surface thereof.

That is, as illustrated in FIG. 2, when the second dielectric layer 200 is coated on the first dielectric layer 100, the first protrusion 130 can be inserted in the first groove 120, and the second groove 220 can be formed on a backside of the first protrusion 130.

In such a case, by coating the second dielectric layer 200 on the first dielectric layer 100 having the first grooved 120 formed thereon, the first protrusion 130 and the second groove 220 can be naturally formed while the second dielectric layer 200 fills in a portion where the first groove 120 is formed. Moreover, as the second dielectric layer 200 is also made of a photosensitive dielectric material, the second groove 220 can be formed on the second dielectric layer 200 more precisely through a patterning process.

Meanwhile, the first coil 110 can be made of copper or aluminum, which is highly conductive and workable, and the first coil 110 can be formed through an etching method or an additive method (plating method) using photolithography, but the material and method for forming the first coil 110 shall not be limited to what is described herein and can be variously modified as necessary.

The third dielectric layer 300 can be coated on the second dielectric layer 200 so as to cover a second coil 210 that is laminated on the second dielectric layer 200, can have a second protrusion 230 corresponding to the second groove 220 formed on one surface thereof that is in contact with the second dielectric layer 200, and can have a third groove 320 formed on the other surface thereof.

That is, as shown in FIG. 2, when the third dielectric layer 300 is coated on the second dielectric layer 200, the second protrusion 230 can be inserted in the second groove 220, and the third groove 320 can be formed on a back side of the second protrusion 230. Here, the external electrode 20 or the filling layer 30 can be filled in the third groove 320.

In such a case as well, by coating the third dielectric layer 300 on the second dielectric layer 200 having the second grooved 220 formed thereon, the second protrusion 230 and the third groove 320 can be naturally formed while the third dielectric layer 300 fills in a portion where the second groove 220 is formed. Moreover, as the third dielectric layer 300 is also made of a photosensitive dielectric material, the third groove 320 can be formed on the third dielectric layer 300 more precisely through a patterning process.

Meanwhile, the second coil 210 can be also made of copper or aluminum, which is highly conductive and workable, and the second coil 210 can be formed through an etching method or an additive method (plating method) using photolithography, but the material and method for forming the second coil 210 shall not be limited to what is described herein and can be variously modified as necessary. Moreover, the second coil 210 can be connected with the first coil 110 through, for example, a via.

As such, in the common mode filter 1000 in accordance with the present embodiment, interfacial adhesion can be enhanced because the dielectric layers 100, 200, 300 are laminated as the first protrusion 130 is inserted in the first groove 120 and the second protrusion 230 is inserted in the second groove 220.

Moreover, in case moisture is penetrated through an interface, the protrusions 130, 230 can function as shielding walls to prevent further penetration of the moisture. Particularly, even though there is separation in the interface, the path of moisture penetration on the interface can become extended by the protrusions 130, 230, and thus the penetration of moisture through the interface can be effectively prevented.

Figure 4:
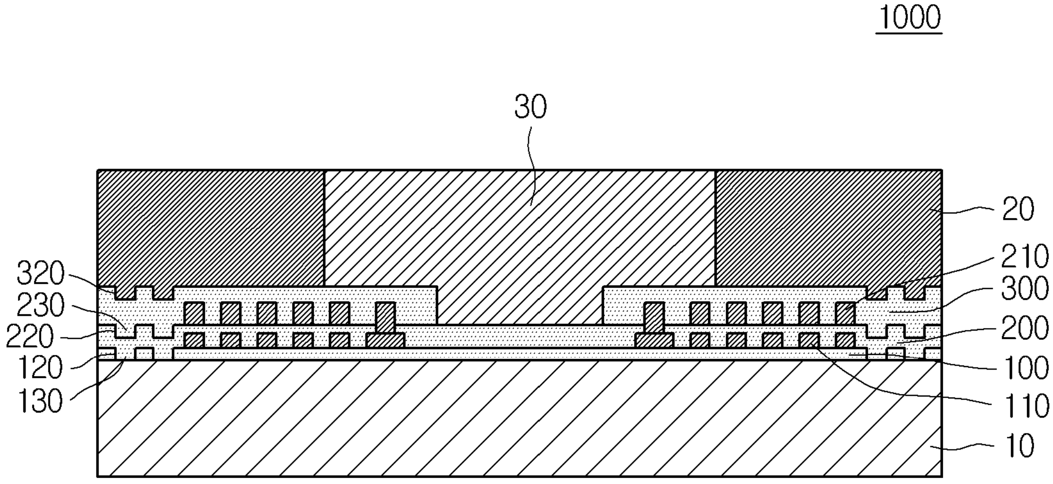
FIG. 4 and FIG. 5 show modification examples of the common mode filter in accordance with an embodiment of the present invention.
Figure 5:
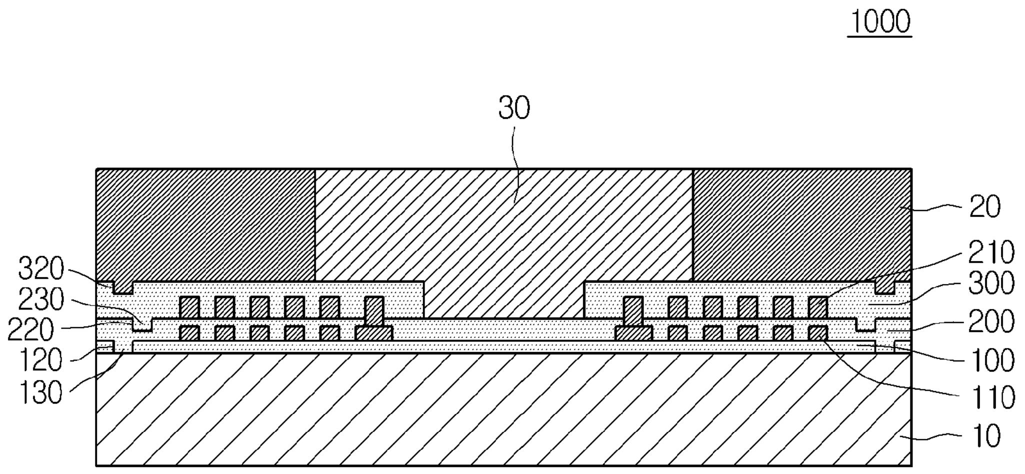

FIG. 4 and FIG. 5 show modification examples of the common mode filter in accordance with an embodiment of the present invention.

As illustrated in FIG. 4, in the common mode filter 1000 in accordance with an embodiment of the present invention, the first groove 120 to third groove 320 can be each formed in plurality on the first dielectric layer 100 to third dielectric layer 300, respectively.

That is, the first groove 120 to third groove 320 can be formed in plural rows on the first dielectric layer 100 to third dielectric layer 300, respectively, and the first protrusion 130 and the second protrusion 230 can be also formed in plural rows and inserted in the first groove 120 and the second groove 220, respectively.

Through this, the interfacial adhesion can be further enhance, and the penetration of moisture through the interface can be prevented more effectively.

Moreover, as illustrated in FIG. 5, in the common mode filter 1000 in accordance with an embodiment of the present invention, the first groove 120 to third groove 320 can be formed to misalign with one another.

That is, center lines of the first groove 120 to third groove 320 can be placed to be parallel with one another but not on a same longitudinal line in a longitudinal section.

Figure 6:
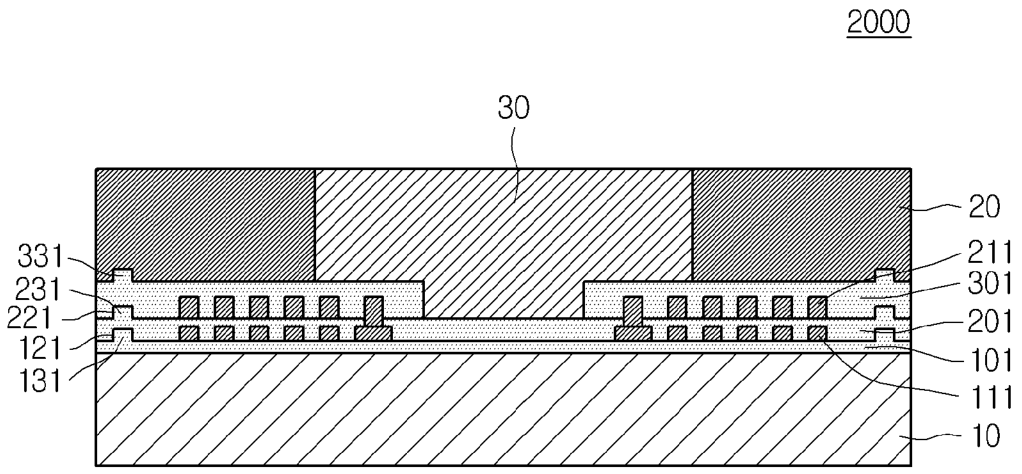
FIG. 6 shows a longitudinal section of the common mode filter in accordance with another embodiment of the present invention.

Through this, stress may not be concentrated on the first groove 120 to third groove 320, and thus it becomes possible to prevent the outer boundary portion of the common mode filter 1000 from being vulnerable to stress, and even if separation occurs in the interface, locations of separation can be varied, and thus the separation in the interface can be minimized FIG. 6 shows a longitudinal section of the common mode filter in accordance with another embodiment of the present invention.

As illustrated in FIG. 6, a common mode filter 2000 in accordance with another embodiment of the present invention also includes a first dielectric layer 101, a second dielectric layer 210 and a third dielectric layer 301.

The first dielectric layer 101 is a portion where a first protrusion 131 is formed along the outer boundary portion and can insulate the substrate 10 and a first coil 111 and provide smoothness of a surface on which the first coil 111 is laminated.

In such a case, an additional dielectric layer made of a photosensitive dielectric material can be coated on top of the first dielectric layer 101, and then the additional dielectric layer can be patterned, leaving out the first protrusion 131, to form the first protrusion 131.

The second dielectric layer 201 can be coated on the first dielectric layer 101 so as to cover the first coil 111 that is laminated on the first dielectric layer 101, can have a first groove 121 corresponding to the first protrusion 131 formed on one surface thereof that is in contact with the first dielectric layer 101, and can have a second protrusion 231 formed on the other surface thereof.

That is, as illustrated in FIG. 6, when the second dielectric layer 201 is coated on the first dielectric layer 101, the first protrusion 131 can be inserted in the first groove 121, and the second groove 231 can be formed on a backside of the first groove 121.

In such a case, by coating the second dielectric layer 201 on the first dielectric layer 101 having the first grooved 131 formed thereon, the first protrusion 121 and the second groove 231 can be naturally formed while the second dielectric layer 201 covers a portion where the first protrusion 131 is formed. Moreover, an additional dielectric layer made of a photosensitive dielectric material can be also coated on top of the second dielectric layer 201, and then the additional dielectric layer can be patterned, leaving out the second protrusion 231, to form the second protrusion 231 more precisely.

The third dielectric layer 301 can be coated on the second dielectric layer 201 so as to cover a second coil 211 that is laminated on the second dielectric layer 201, can have a second groove 221 corresponding to the second protrusion 231 formed on one surface thereof that is in contact with the second dielectric layer 201, and can have a third protrusion 331 formed on the other surface thereof.

That is, as shown in FIG. 6, when the third dielectric layer 301 is coated on the second dielectric layer 201, the second protrusion 231 can be inserted in the second groove 221, and the third protrusion 331 can be formed on a back side of the second groove 221. Here, an external electrode 20 or a filling layer 30 can be covered on the third protrusion 331.

In such a case as well, by coating the third dielectric layer 301 on the second dielectric layer 201 having the second protrusion 231 formed thereon, the second groove 221 and the third protrusion 331 can be naturally formed while the third dielectric layer 301 covers a portion where the second protrusion 231 is formed. Moreover, an additional dielectric layer made of a photosensitive dielectric material can be also coated on top of the third dielectric layer 301, and then the additional dielectric layer can be patterned, leaving out the third protrusion 331, to form the third protrusion 331 more precisely.

As such, in the common mode filter 2000 in accordance with the present embodiment, interfacial adhesion can be enhanced because the dielectric layers 101, 201, 301 are laminated as the first protrusion 131 is inserted in the first groove 121 and the second protrusion 231 is inserted in the second groove 221.

Moreover, in case moisture is penetrated through an interface, the protrusions 131, 231, 331 can function as shielding walls to prevent further penetration of the moisture. Particularly, even though there is separation in the interface, the path of moisture penetration on the interface can become extended by the protrusions 131, 231, 331, and thus the penetration of moisture through the interface can be effectively prevented.

In the common mode filter 2000 in accordance with the present embodiment, the first protrusion 131 to third protrusion 331 can be formed with a metal pattern laminated on the first dielectric layer 101 to third dielectric layer 301, respectively.

That is, instead of patterning the additional dielectric layer as described above, the first protrusion 131 to third protrusion 331 can be formed by laminating the metal pattern on the dielectric layers 101, 201, 301, similarly to the way the coils 111, 211 are formed.

As a result, the processes for forming the first protrusion 131 to third protrusion 331 can be simplified by, for example, forming the first protrusion 131 to third protrusion 331 simultaneously with the coils 111, 211 or reducing the coating and patterning processes to the lamination process, and thus the common mode filter 2000 in accordance with the present embodiment can be manufactured more easily.

Except for the above-described elements and configurations, the common mode filter 2000 in accordance with another embodiment of the present embodiment has the same or similar elements and configurations as those of the common mode filter 1000 in accordance with an embodiment of the present embodiment, and thus these redundant elements and configurations will not be described herein.

Although certain embodiments of the present invention have been described, it shall be appreciated that there can be a very large number of permutations and modification of the present invention by those who are ordinarily skilled in the art to which the present invention pertains without departing from the technical ideas and scope of the present invention, which shall be defined by the claims appended below.

It shall be also appreciated that many other embodiments than the embodiments described above are included in the claims of the present invention.

What is claimed is:

1. A common mode filter, comprising:

a first dielectric layer having a first groove formed along an outer boundary portion thereof;

a second dielectric layer coated on the first dielectric layer so as to cover a first coil laminated on the first dielectric layer, having a first protrusion corresponding to the first groove formed on one surface thereof being in contact with the first dielectric layer, and having a second groove formed on the other surface thereof; and a third dielectric layer coated on the second dielectric layer so as to cover a second coil laminated on the second dielectric layer, having a second protrusion corresponding to the second groove formed on one surface thereof being in contact with the second dielectric layer, and having a third groove formed on the other surface thereof.

2. The common mode filter of claim 1, wherein the first to third grooves are formed in plural rows on the first to third dielectric layers, respectively.

3. The common mode filter of claim 1, wherein the first to third grooves are formed in such a way that longitudinal positions thereof are misaligned with one another.

4. A common mode filter, comprising:

a first dielectric layer having a first protrusion formed along an outer boundary portion thereof;

a second dielectric layer coated on the first dielectric layer so as to cover a first coil laminated on the first dielectric layer, having a first groove corresponding to the first protrusion formed on one surface thereof being in contact with the first dielectric layer, and having a second protrusion formed on the other surface thereof; and a third dielectric layer coated on the second dielectric layer so as to cover a second coil laminated on the second dielectric layer, having a second groove corresponding to the second protrusion formed on one surface thereof being in contact with the second dielectric layer, and having a third protrusion formed on the other surface thereof.

5. The common mode filter of claim 4, wherein the first to third protrusions are formed in plural rows on the first to third dielectric layers, respectively.

6. The common mode filter of claim 4, wherein the first to third protrusions are formed in such a way that longitudinal positions thereof are misaligned with one another.

7. The common mode filter of claim 4, wherein the first to third protrusions are formed with a metal pattern laminated on the first to third dielectric layers, respectively.

8. The common mode filter of claim 5, wherein the first to third protrusions are formed with a metal pattern laminated on the first to third dielectric layers, respectively.

9. The common mode filter of claim 6, wherein the first to third protrusions are formed with a metal pattern laminated on the first to third dielectric layers, respectively.

* * * * *